United States Patent [19]
Wang

[11] Patent Number: 5,260,105
[45] Date of Patent: Nov. 9, 1993

[54] AEROSOL-PLASMA DEPOSITION OF FILMS FOR ELECTROCHEMICAL CELLS

[75] Inventor: Xingwu Wang, Alfred, N.Y.

[73] Assignee: Alfred University, Alfred, N.Y.

[21] Appl. No.: 871,278

[22] Filed: Apr. 20, 1992

Related U.S. Application Data

[63] Continuation-in-part of Ser. No. 510,011, Apr. 17, 1990, Pat. No. 5,120,703.

[51] Int. Cl.$^5$ .......................... B05D 3/06; B05D 3/02
[52] U.S. Cl. .................................. 427/576; 427/569; 427/565; 427/226; 427/421; 429/30
[58] Field of Search ............... 427/569, 576, 226, 565, 427/427, 421; 429/30, 31, 32, 33

[56] References Cited

U.S. PATENT DOCUMENTS 4,831,965  5/1989  Brian et al. .......................... 118/725
5,032,568  7/1991  Lau et al. .............................. 505/1

Primary Examiner—Roy King
Attorney, Agent, or Firm—Howard J. Greenwald

[57] ABSTRACT

An atmospheric process for the production of a coating or film for electrochemical cells is disclosed. In the first step of this process, an aerosol mist containing reactants necessary to form the desired coating or film is provided. Thereafter, the mist is subjected to radio-frequency radiation while in the plasma region. Thereafter, the vaporized mixture is then deposited onto a substrate.

14 Claims, 2 Drawing Sheets

AEROSOL-PLASMA DEPOSITION OF FILMS FOR ELECTROCHEMICAL CELLS

CROSS-REFERENCE TO RELATED PATENT APPLICATION

This is a continuation-in-part of application Ser. No. 07/510,011, filed on Apr. 17, 1990, now U.S. Pat. No. 510,011.

FIELD OF THE INVENTION

An atmospheric process, using deposition of plasma vapor, for coating layers of substrate to prepare a coated material which may be used in a multilayer structure electrochemical battery (such as a fuel cell) is disclosed.

BACKGROUND OF THE INVENTION

A fuel cell is a device which generates electrical energy by converting chemical energy, derived from a fuel supplied to the cell, directly into electrical energy by oxidation of fuel in the cell. These cells are well known to those skilled in the art and are described, e.g., in U.S. Pat. No. 4,988,583 of Watkins et al., U.S. Pat. No. 4,997,726 of Akiyama et al., U.S. Pat. No. 4,981,763 of Mitsuda et al., U.S. Pat. No. 5,026,601 of Iio et al., U.S. Pat. No. 5,021,304 of Ruka et al., U.S. Pat. No. 4,988,582 of Dyer, U.S. Pat. No. 5,035,961 of Riley, and U.S. Pat. No. 4,863,813 of Dyer. The disclosure of each of these United States patents is hereby incorporated by reference into this specification.

Electrochromic devices are also well known. These devices typically are comprised of thin layers of inorganic oxides that change color upon the application of an electric field, maintain the changed condition after the field is turned off, and return to the original state after pole reversal. See, for example, U.S. Pat. No. 4,852,979 of Agrawal as well as U.S. Pat. Nos. 3,712,710, 3,844,636, and 4,465,339. The disclosure of each of these patents is hereby incorporated by reference into this specification.

Both fuel cells and electrochromic cells are electrochemical devices which are comprised of a multiplicity of layers.

One preferred class of such electrochemical devices is the solid devices, such as solid fuel cells, and solid electrochromic cells. These solid devices are often prepared by coating a substrate to produce two or more of the layers used in the structure.

To the best of applicant's knowledge, an economical, reliable process for the large-scale production of high-quality coated electrochemical cell structures has not been provided by the prior art. Thus, by way of illustration, in a publication entitled "Fuel Cells: A Handbook (publication DOE/METC-88/6096 [DE88010252], which was published by the United States Department of Energy, Office of Fossil Energy, Morgantown Energy Technology Center, Morgantown, W.V., in 1988), the disadvantages of electrochemical vapor deposition ("EVD") prior art coating process were discussed. At page 95 of this publication, it is disclosed that "Electrochemical vapor deposition (EVD) presents several limitations in the fabrication of cell interconnections: (a)limited choice of dopants (only Mg has been successfully utilized in Mg-doped lanthanum chromite); (b)non-uniform film thicknesses are deposited; (c)non-uniform dopant concentrations are obtained; and (d)impurities from the gas phase are deposited which may affect the conductivity of the film."

The prior art "EVD" coating process is relatively complicated and, thus, relatively expensive. Thus, at page 597 of A. J. Apleby et al.'s "Fuel Cell Handbook" (Van Nostrand Reinhold, New York, 1989), it is disclosed that this prior art process ". . . involves many complex steps." Thus, e.g., at pages 594-595 of Apleby's book, it is stated that, in the EVD process, ". . .an equimolar mixture of hydrogen gas and water vapor is passed through the porous support tube. . .under low pressure conditions, while the appropriate metal chloride vapors surround the outside of the tube. . .The delivery rate of the metal chloride is controlled by regulating the flow of chlorine over a mixture of granular oxide-lampblack mixture."

On Dec. 20, 1991, the Gas Research Institute of Chicago, Ill. issued a Request for Proposal #92-260-0419, entitled "Intermediate Temperature. . .Planar, Ceramic Electrolyte Fuel Cell Structures." At page 5 of the Request, it was indicated that "A key technical challenge in the fabrication of robust, durable, gas-tight, thin-film structures that operate in aggressive. . .gaseous environments." These structures had not been provided by the prior art.

It is an object of this invention to provide a process for preparing ". . . robust, durable, gas-tight, thin-film structures that operate in aggressive. . .gaseous environments" and which can be used in fuel cells.

It is another object of this invention to provide a process for preparing ". . . robust, durable,. . .thin-film structures that operate in aggressive. . .environments" and which can be used in electrochromic cells.

It is yet another object of this invention to provide a coating process which can be conducted under atmospheric conditions.

It is yet another object of this invention to provide a coating process which produces a coated substrate which is substantially homogeneous.

It is yet another object of this invention to provide a coating process which does not require that the substrate used in the process be heated.

It is yet another object of this invention to provide a coating process which does not require that the coating applied to the substrate material be annealed after deposition.

It is yet another object of this invention to provide a process for the production of coatings which is suitable for the large-scale production of such coatings.

It is yet another object of this invention to provide a process for the production of coatings which can be used to produce complex, coated shaped articles.

SUMMARY OF THE INVENTION

In accordance with this invention, there is provided an atmospheric process for the production of a coating or film. In the first step of this process, an aerosol mist containing reactants necessary to form the coating is provided. Thereafter, the mist is subjected to radio-frequency radiation while in the plasma region. Thereafter, the vaporized mixture is then deposited onto a substrate. In subsequent steps, one or more other layers of vaporized material may be deposited onto the coated substrate.

BRIEF DESCRIPTION OF THE DRAWING

The present invention will be more fully understood by reference to the following detailed description thereof, when read in conjunction with the attached drawing, wherein like reference numerals refer to like elements, and wherein.

DESCRIPTION OF THE PREFERRED EMBODIMENTS

Figure 1:
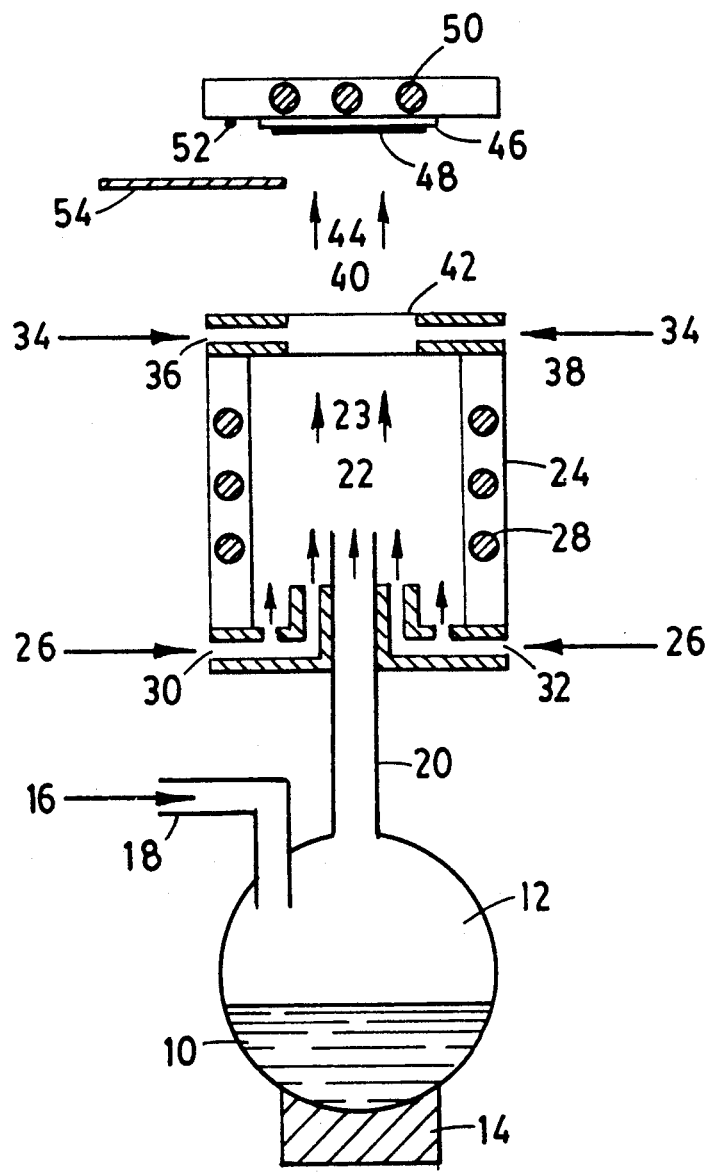
FIG. 1 is a system diagram illustrating one preferred embodiment of the process of this invention.

FIG. 1 illustrates a preferred embodiment of applicant's process. In the first step of the process, a solution 10 of reagents is charged into misting chamber 12.

The reagents charged into misting chamber 12 will be sufficient to form a layer of the desired material in the process. The nature and identity of these reagents will be discussed later in this specification after the general process is discussed.

Referring again to FIG. 1, the solution 10 in misting chamber 12 is preferably caused to form into an aerosol, such as a mist.

The term aerosol, as used in this specification, refers to a suspension of ultramicroscopic solid or liquid particles in air or gas, such as smoke, fog, or mist. See, e.g., page 15 of "A dictionary of mining, mineral, and related terms," edited by Paul W. Thrush (U.S. Department of the Interior, Bureau of Mines, 1968), the disclosure of which is hereby incorporated by reference into this specification. In general, the aerosol particles have diameters of from about 0.1 to about 100 microns and, preferably, less than about 10 microns.

As used in this specification, the term mist refers to gas-suspended liquid particles which have diameters less than 10 microns.

The aerosol/mist consisting of gas-suspended liquid particles with diameters less than 10 microns may be produced from solution 10 by any conventional means which causes sufficient mechanical disturbance of said solution. Thus, one may use mechanical vibration. In one preferred embodiment, ultrasonic means are used to mist solution 10.

As is known to those skilled in the art, ultrasonic sound waves (those having frequencies above 20,000 hertz) may be used to mechanically disturb solutions and cause them to mist. Thus, by way of illustration, one may use the ultrasonic nebulizer sold by the DeVilbiss Health Care, Inc. of Somerset, Pa.; see, e.g., the Instruction Manual for the "Ultra-Neb 99 Ultrasonic Nebulizer, publication A-850-C (published by DeVilbiss, Somerset, Pa., 1989), the disclosure of which is hereby incorporated by reference into this specification.

In the embodiment shown in FIG. 1, the oscillators of ultrasonic nebulizer 14 are shown contacting an exterior surface of misting chamber 12. In this embodiment, the ultrasonic waves produced by the oscillators are transmitted via the walls of the misting chamber 12 and effect the misting of solution 10.

In another embodiment, not shown, the oscillators of ultrasonic nebulizer 14 are in direct contact with solution 10.

It is preferred that the ultrasonic power used with such machine should be in excess of one watt and, more preferably, in excess of 10 watts. In one embodiment, the power used with such machine exceeds about 50 watts.

During the time solution 10 is being caused to mist, it is preferably contacted with carrier gas to apply pressure to the solution and mist. It is preferred that a sufficient amount of carrier gas is introduced into the system at a sufficiently high flow rate so that pressure on the system is in excess of atmospheric pressure. Thus, for example, in one embodiment wherein chamber 12 has a volume of about 200 cubic centimeters, the flow rate of the carrier gas was from about 100 to about 150 milliliters per minute.

The carrier gas 16 is introduced via feeding line 18 at a rate sufficient to cause solution 10 to mist at a rate of from about 0.5 to about 20 milliliters per minute. In one embodiment, the misting rate of solution 10 was from about 1.0 to about 3.0 milliliters per minute.

Substantially any gas which facilitates the formation of plasma may be used as carrier gas 16. Thus, by way of illustration, one may use oxygen, air, argon, nitrogen, and the like. It is preferred that the carrier gas used be a compressed gas under a pressure in excess 760 millimeters of mercury. In this embodiment, the use of the compressed gas facilitates the movement of the mist from the misting chamber 12 to the plasma region 22.

The misting container 12 may be any reaction chamber conventionally used by those skilled in the art and should preferably be constructed out of such acid-resistant materials such as glass, plastic, and the like.

The mist from misting chamber 12 is fed via misting outlet line 20 into the plasma region 22 of plasma reactor 24. In plasma reactor 24, the mist is mixed with plasma generated by plasma gas 26 and subjected to radio frequency radiation provided by a radio-frequency coil 28.

The plasma reactor 24 provides energy to form plasma and to cause the plasma to react with the mist. Any of the plasmas reactors well known to those skilled in the art may be used as plasma reactor 24. Some of these plasma reactors are described in J. Mort et al., "Plasma Deposited Thin Films" (CRC Press Inc., Boca Raton, Fla., 1986); "Methods of Experimental Physics," Volume 9--Parts A and B, Plasma Physics (Academic Press, New York, 1970/1971); N. H. Burlingame, "Glow Discharge Nitriding of Oxides," Ph.D. thesis ( Alfred University, Alfred, N.Y., 1985), available from University Microfilm International, Ann Arbor, Mich. Each of these publications is hereby incorporated by reference into this specification.

In one preferred embodiment, the plasma reactor 24 was "model 56 torch" available from the TAFA Inc. of Concord, N.H. It was operated at a frequency of about 4 megahertz and an input power of 30 kilowatts.

Into feeding lines 30 and 32 is fed plasma gas 26. As is known to those skilled in the art, a plasma can be produced by passing gas into a plasma reactor. A discussion of the formation of plasma is contained in B. Chapman's "Glow Discharge Processes" (John Wiley & Sons, New York, 1980), the disclosure of which is hereby incorporated by reference into this specification.

In one preferred embodiment, the plasma gas used is a mixture of argon and oxygen. In another embodiment, the plasma gas is a mixture of nitrogen and oxygen. In yet another embodiment, the plasma gas is pure argon or pure nitrogen.

When the plasma gas is pure argon or pure nitrogen, it is preferred to introduce into the plasma reactor at a flow rate of from about 5 to about 30 liters per minute.

When a mixture of oxygen and either argon or nitrogen is used, the concentration of oxygen in the mixture should preferably be from about 1 to about 40 volume percent and, preferably, from about 15 to about 25 volume percent. When such a mixture is used, the flow rates of each gas in the mixture should be adjusted to obtain the desired gas concentrations. Thus, by way of illustration, in one embodiment which uses a mixture of argon and oxygen, the argon flow rate was 15 liters per minute, and the oxygen flow rate was 40 liters per minute.

In one embodiment, auxiliary oxygen 34 is fed into the top of reactor 24, between the plasma region 22 and the flame region 40, via lines 36 and 38. In this embodiment, the auxiliary oxygen is not involved in the formation of plasma but is involved in the enhancement of the oxidation of the material.

Radio frequency energy is applied to the reagents in the plasma reactor 24, and it causes vaporization of the mist.

In general, the energy is applied at a frequency of from about 100 to about 30,000 kilohertz. In one embodiment, the radio frequency used is from about 1 to 20 megahertz. In another embodiment, the radio frequency used is from about 3 to about 5 megahertz.

As is known to those skilled in the art, such radio frequency alternating currents may be produced by conventional radio frequency generators. Thus, by way of illustration, said TAPA Inc. "model 56 torch" is attached to a radio frequency generator rated for operation at 35 kilowatts which manufactured by Lepel Company (a division of TAFA Inc.) and which generates an alternating current with a frequency of 4 megaherz at a power input of 30 kilowatts. Thus, e.g.,. one may use an induction coil driven at 2.5–5.0 megahertz which is sold as the "PLASMOC 2" by ENI Power Systems, Inc. of Rochester, N.Y.

The use of these type of radio-frequency generators is described in the Ph.D. theses entitled (1) "Heat Transfer Mechanisms in High-Temperature Plasma Processing of Glasses," Donald M. McPherson (Alfred University, Alfred, N.Y., January, 1988) and (2) the aforementioned Nicholas H. Burlingame's "Glow Discharge Nitriding of Oxides." The disclosure of each of these publications is hereby incorporated by reference into this specification.

The plasma vapor 23 formed in plasma reactor 24 is allowed to exit via the aperture 42 and can be visualized in the flame region 40. In this region, the plasma contacts air which is at a lower temperature than the plasma region 22, and a flame is visible. A theoretical model of the plasma/flame is presented on pages 88 et seq. of said McPherson thesis.

The vapor 44 present in flame region 40 is propelled upward towards substrate 46. Any material onto which vapor 44 will condense may be used as a substrate. Thus, by way of illustration, one may use materials such as, metal, ceramic, glass, and the like.

As is known to those skilled in the art, the typical solid fuel cell is comprised of a solid anode, a solid electrolyte, and a solid cathode. As will be apparent to those skilled in the art, two of these layers may be formed by depositing a vapor onto a substrate.

Figure 2:
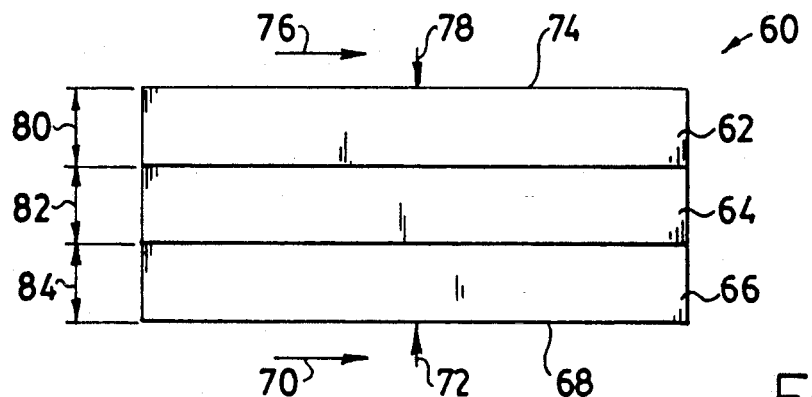
FIG. 2 is a schematic representation of a typical fuel cell unit.

Referring to FIG. 2, it will be seen that fuel cell 60 is comprised of anode 62, electrolyte 64, and cathode 66. A oxygen containing gas (such as air or oxygen) is preferably provided near surface 68 of cathode 66, and it may be flowed past surface 68 in the direction of arrow 70. Alternatively, or additionally, it may be caused to contact the surface 68 by being flowed in the direction of arrow 72.

A hydrogen-containing gas (such as, e.g., hydrogen, natural gas, etc.) is similarly caused to contact surface 74 by being flowed in the direction of arrow 76 and/or 78.

The anode 62 used in such fuel cell 60 is well known to those skilled in the art and are described, e.g., on pages 313–355 and 579–611 of said Appleby et al. book. Thus, by way of illustration, the anode of such fuel cell may consist essentially of either porous platinum or nickel-zirconia cermet.

It is preferred that the porosity of the anode used in the fuel cell be from about 10 to about 50 volume percent and, more preferably, from about 20 to about 40 volume percent. In general, and referring again to FIG. 2, anode 6 preferably has a thickness of at least about 10 microns.

Anode 62 may be comprised of porous platinum. As is known to those skilled in the art, platinum traditionally has been used in thin layers of from about 0.01 to about 1.5 milligrams per square centimeter and loaded onto substrates such as carbon, metalized Teflon, and a variety of other stable metals; see, e.g., page 323 of said Appleby et al. book. Thus, by way of illustration, the anode may be a platinum or platinum alloy material supported on a porous substrate of a mixture of a hydrophobic polymer and a carbon supported catalyst (see U.S. Pat. Nos. 4,851,377 and 4,808,493, the disclosure of each of which is hereby incorporated by reference into this specification).

In one embodiment, it is preferred that anode 62 be a nickel/zirconia cermet material with the specified porosity. This materials are well known to those skilled in the art. Thus, for example, at pages 591–592 of such Appleby et al. book, it is disclosed that such a material may be prepared from a slurry of nickel oxide and zirconia wherein the nickel oxide/zirconia molar ratio is equal to or greater than 0.667. Thus, for example, the anode may consist of a metallic nickel and yttria-stabilized zirconia skeleton; see, e.g., page 93 of said "Fuel Cells...Handbook" published by the Department of Energy.

Referring again to FIG. 2, electrolyte 64 is integrally connected to anode 62. It is preferred that electrolyte 64 have a porosity of less than about 5 volume percent so that substantially no gas can pass through it. It is even more preferred that the porosity of electrolyte 64 be less than about 1.0 volume percent.

In one preferred embodiment, electrolyte 64 consists essentially of stabilized zirconia which may be, e.g., yttria- or calcia-stabilized zirconia. These electrolytes are well known to those skilled in the art and are described, e.g., in U.S. Pat. Nos. 4,831,965, 4,937,152, 4,950,562, and 4,971,830, the disclosure of each of which is hereby incorporated by reference into this specification.

In another embodiment, electrolyte 64 may be bismuth oxide stabilized zirconia, or a zirconia stabilized with both bismuth (25 percent), calcia (2 percent), and yttria. These electrolytes are discussed in the "Annual Technical Progress Report" for the period from December, 1987 to December, 1988 which is entitled "Development of Planar Geometry Solid Oxide Fuel Cells" and which is published by the Gas Research Institute of Chicago, Ill.

The electrolyte 64 may have the perovskite structure. Thus, e.g., the electrolyte 64 may consist essentially of $BaTh_{0.9}Gd_{0.1}O_3$, or $BaCe_{0.9}Gd_{0.1}O_3$, or $Sr_2Gd_2O_5$, or $Sr_2Dy_2O_5$. These electrolytes are described, e.g., on page 126 of "Fossil Energy," "Proceedings of the Third Annual Fuel Cells Contractors Review Meeting," DOE/METC-91/6120(DE91002085), published by the United States Department of Energy in June of 1991.

Referring again to FIG. 2, it will be seen that electrolyte 64 preferably has a thickness of at least about 10 microns and, preferably, from about 10 to about 20 microns. Solid electrolyte 64 is integrally connected to both solid anode 62 and solid cathode 66.

The cathode 66 has a porosity of from about 10 to about 50 volume percent and, preferably, from about 20 to about 40 volume percent. In one preferred embodiment, cathode 66 is a porous strontia-doped lanthanum manganite perovskite of the formula $La_{l-x}Sr_xMnO_3$, wherein x is preferably from about 0.1 to about 0.15. Alternatively, cathode 66 may consist essentially of porous platinum material (see the description of this material elsewhere in the specification), stabilized zirconia material impregnated with praseodymium oxide (see page 92 of the aforementioned "Fuel Cells. . .Handbook"), $(La,Ca)(Cr,Co)O_3$) or (Y,Ca) or $(Cr,Mn,Co)O_3$ (see page 173 of the aforementioned "Proceedings of the Second Annual Fuel Cells Contractors Review Meeting," supra), and the like.

It is preferred that said cathode consist essentially of said porous strontia-doped lanthanum manganite perovskite material. This material is well known to those skilled in the art and is described, e.g., in U.S. Pat. Nos. 4,948,680, 4,920,015, and 4,831,965, the disclosure of each of which is hereby incorporated by reference into this specification.

In general, the thickness 84 of cathode 66 is typically at least about 10 microns.

Figure 3:
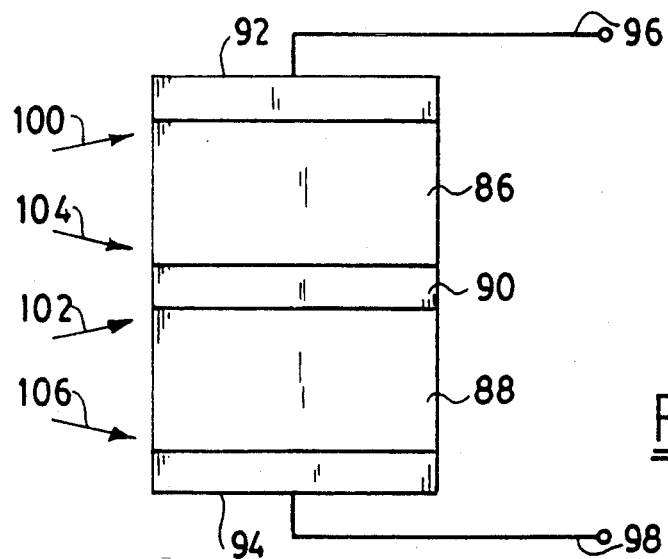
FIG. 3 is a schematic representation of fuel cell with two unit cells in series.

Referring to FIG. 3, it will be seen fuel cell unit 86 and fuel cell unit 88 (each of which have the configuration of the unit 60 of FIG. 2) may be joined by interconnector 90 and outerconnectors 92 and 94. In this embodiment, during the operation of the fuel cell, a voltage is developed across leads 96 and 98.

In the operation of the cell of FIG. 3, fuel is flowed in the directions of arrows 100 and 102, and oxidant is flowed in the direction of arrows 104 and 106.

The interconnector material 90 preferably consists essentially of either platinum, or manganese-doped cobalt chromite, or magnesium-doped lanthanium chromite, and preferably has a thickness of at least about 10 microns; see, e.g., page 92 of said "Fuel Cells. . .Handbook." Alternatively, the innerconnector material 92 may consist essentially of $La(Mg)CrO_3$, or $La(Sr)CrO_3$, or $La(Sr)MnO_3$; see, e.g., page 99 of said "Proceedings of the Third Annual Fuel Cells Contractors Review Meeting," supra.

The interconnector material 90 preferably has a porosity of less than about 5.0 volume percent and, more preferably, less than about 1.0 volume percent.

Referring again to FIG. 3, the outerconnectors 92 and 94 may consist essentially of the same material as interconnector 90, or one or both of them may consist essentially of different material(s). The porosity of outerconnectors 92 and 94 is also less than about 5.0 volume percent, and, preferably, less than about 1.0 percent.

Outerconnectors 92 and 94, unit cells 86 and 88, and interconnector 90 preferably form an integral structure.

In the process of this invention, it is preferred to form the structures of FIGS. 2 and/or 3 by sequentially applying a coating upon a substrate to first form a coated substrate, and thereafter applying one or more additional coatings on such substrate.

When preparing a fuel cell, it is preferred to "stack" the multilayers of the cell by working either from the bottom up or the top down. Thus, referring to FIG. 2, one could first coat a material designed to form either anode 62 or cathode 66 upon a connector material (not shown) and, thereafter, coat electrolyte 64 upon the coated connector material.

Figure 4:
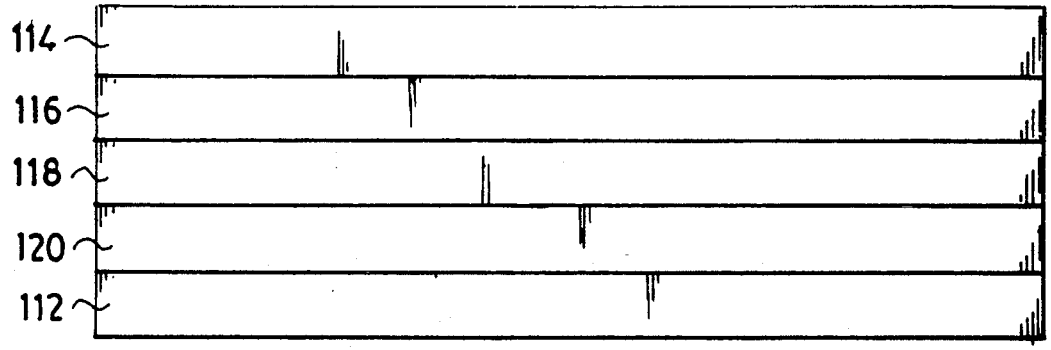
FIG. 4 is a schematic representation of an electrochromic window cell.

FIG. 4 illustrates a typical electrochromic window cell. Referring to FIG. 4, it will be seen that electrochromic window cell 110 is comprised of conducting layers 112 and 114, electrochromic layer 116, ion conducting layer 118, and counterelectrode layer 120. This window cell, and its components, are well known to those skilled in the art and are described in U.S. Pat. Nos. 3,712,710, 4,775,227, 3,844,636, 4,844,591, 4,465,339, 4,878,743, 4,824,222, 4,902,110, and the like. The description of each of these patents is hereby incorporated by reference into this specification.

By way of illustration, electrochromic layer 116 may consist of inorganic materials such as, e.g., the hydrous oxides of Group VIII cations, nickel hydroxide, iridium oxide, rhodium dioxide, and the like. Alternatively, electrochromic layer 116 may consist essentially of tungsten oxide, $Li_xWO_3$, molybdenum trioxide, niobium pentoxide, vanadium pentoxide, titanium dioxide, and other compound consisting of tungsten oxide, molybdenum trioxide, lithium oxide, boron oxide, phosphorous pentoxide, sodium oxide, potassium oxide, and the like.

By way of further illustration, ion conducting layer (Electrolyte) 118 may consist essentially of hydrogen ion conductors such zirconia, hafnia, tantalum oxide, strontium oxide, calcium fluoride, and the like. Alternatively, layer 118 may consist essentially of alkali metal ion conductors such as lithium nitride, lithiummagnesium fluoride, lithium titanate, lithium tantalate, sodium silicate, and the like.

By way of further illustration, counterelectrode layer 120 may consist essentially of vanadium pentoxide, niobium pentoxide, indium trioxide, and the like.

The conducting layer 112/114 may consist essentially of transparent tin oxide, indiumtin oxide, and the like.

In one preferred embodiment, one of conducting layers 112/114 is nontransparent and consists essentially of platinum metal and/or its alloy(s).

By way of further illustration, the substrate used to prepare the window cell 110 may consist essentially of glass.

It will be readily apparent to those skilled in the art that the aforementioned listing of potential substrates is merely meant to be illustrative, and it will be apparent that many other substrates may be used. Thus, by way of illustration, one may use any of the substrates mentioned in M. Sayer's "Ceramic Thin Films. . ." article, supra. Thus, for example, it is preferred to use one or more of the substrates described on page 286 of "Superconducting Devices," edited by S. T. Ruggiero et al. (Academic Press, Inc., Boston, 1990), the disclosure of which is hereby incorporated by reference into this specification.

One advantage of applicants' process is that the substrate may be of substantially any size or shape, and it may be stationary or movable. Because of the speed of the coating process, the substrate 46 may be moved across the aperture 42 and have any or all of its surface be coated with the film 48.

The substrate may be at ambient temperature. Alternatively, one may use additional heating means to heat the substrate prior to, during, or after deposition of the coating.

In one preferred embodiment, heater 50 is used to heat the substrate to a temperature of from about 100 to about 800 degrees centigrade.

Temperature sensing means 52 may be used to sense the temperature of the substrate and, by feedback means (not shown) adjust the output of heater 50. In one embodiment, not shown, when the substrate 46 is relatively near flame region 40, then optical pyrometry measurement means (not shown) may be used to measure the temperature near the substrate.

In one embodiment, illustrated in FIG. 1, a shutter 54 is used to selectively interrupt the flow of vapor 44 to substrate 46. The use of this shutter 54 is important prior to the time the flame region has become stable; and the vapor should not be allowed to impinge upon the substrate prior to such time.

The substrate 46 may be moved in a plane which is substantially parallel to the top of plasma chamber 24. Alternatively, or additionally, it may be moved in a plane which is substantially perpendicular to the top of plasma chamber 24. In one embodiment, the substrate 46 is moved stepwise along a predetermined path to coat the substrate only at certain predetermined areas.

In one embodiment, rotary substrate motion is utilized to expose as much of the surface of a complex-shaped article to the coating. This rotary substrate motion may be effected by conventional means. See, e.g., "Physical Vapor Deposition," edited by Russel J. Hill (Temescal Division of The BOC Group, Inc., Berkeley, Calif., 1986). the disclosure of which is hereby incorporated by reference into this specification.

The process of this invention allows one to coat an article at a deposition rate of from about 0.01 to about 10 microns per minute and, preferably, from about 0.1 to about 1.0 microns per minute, with a substrate with an exposed surface of 35 square centimeters. One may determine the thickness of the film coated upon said reference substrate material (with an exposed surface of 35 square centimeters) (a higher concentration productes a larger particle size), and/or the pressure of carrier gas 16 (the higher the pressure of gas 16, the faster the deposition rate, and the higher the porosity of the coated article), the temperature of the substrate (the higher the substrate temperature, the larger the size of the grains deposited), the radio-frequency energy used (the higher the energy, the larger the grain size deposited), energy supplied by the ultrasonic nebulizer (the greater the energy, the faster the deposition rate), and the like, one may control the porosity of the material deposited onto the substrate.

It is preferred that the generation of the vapor in plasma rector 24 be conducted under substantially atmospheric pressure conditions. As used in this specification, the term substantially atmospheric" refers to a pressure of at least about 600 millimeters of mercury and, preferably, from about 600 to about 1,000 millimeters of mercury. It is preferred that the vapor generation occur at about atmospheric pressure. As is well known to those skilled in the art, atmospheric pressure at sea level is 760 millimeters of mercury; see, e.g., page 60 of said "A dictionary of mining, mineral, and related terms," supra.

The process of this invention may be used to produce coatings on a flexible substrate. One may deposit the coating directly onto such a strip. Alternatively, one may first deposit one or more buffer layers onto the strip(s).

The deposition of buffer layers between a substrate and a coating is well known to those skilled in the art. See, e.g., (1)H. S. Kwok et al., "Laser evaporation deposition of superconducting and dielectric thin films," Applied Physics Letters, Volume 52 (21), May 23, 1988; (2)S. Witanachchi et al., "Laser Deposition of Superconducting and Semiconducting by means well known to those skilled in the art.

The film thickness can be monitored in situ, while the vapor is being deposited onto the substrate. Thus, by way of illustration, one may use an IC-6000 thin film thickness monitor (as referred to as "deposition controller") manufactured by Leybold Inficon Inc. of East Syracuse, N.Y.

The deposit formed on the substrate may be measured after the deposition by standard profilemetry techniques. Thus, e.g., one may use a DEKTAK Surface Profiler, model number 900051 (available from Sloan Technology Corporation, Santa Barbara, Calif.)

In general, the process of this invention may be used to deposit film layers, each of which is from about 0.1 to about 500 microns and, preferably, from about 1 to about 100 microns. In a more preferred embodiment, each of the film layers deposited by the process is from about 10 to about 50 microns in thickness.

In one embodiment, the as-deposited film layer produced by the process of this invention consists of uniform, small grains. The term "as-deposited" refers to the film prior to the time it is subjected to post-annealing.

In this preferred embodiment, at least about 80 volume percent of the particles in the as-deposited film are smaller than about 1 microns. It is preferred that, in this embodiment, at least about 90 percent of such particles are smaller than 1 micron. Because of this fine grain size, the surface of the film layer is relatively smooth.

In one preferred embodiment, the as-deposited film is post-annealed.

Applicant's process provides a substantial amount of flexibility in varying the porosity of the film deposited. By varying such factors as the concentration of solution 10 Thin Films," in "Superconductivity and its Applications," edited by H. S. Kwok et al. (Elsevier Company, New York, 1988), at pages 194 et seq. The disclosure of each of these publications is hereby incorporated by reference into this specification.

Referring again to FIG. 1, the solution 10 will preferably contain ions in substantially the stoichiometric ratio needed to form the desired coating. These ions are preferably available in solution 10 in water-soluble form, such as, e.g., in the form of water-soluble salts. Thus, e.g., one may use the nitrates or the chlorides or the sulfates or the phosphates of the cations. Other anions which form soluble salts with the cation(s) also may be used.

Alternatively, one may use salts soluble in solvents other than water. Some of these other solvents which may be used to prepare the material include nitric acid, hydrochloric acid, phosphoric acid, sulfuric acid, and the like. As is well known to those skilled in the art, many other suitable solvents may be used; see, e.g., J. A.

Riddick et al., "Organic Solvents, Techniques of Chemistry," Volume II, 3rd edition (Wiley-Interscience, New York, N.Y., 1970), the disclosure of which is hereby incorporated by reference into this specification.

In one preferred embodiment, where a solvent other than water is used, each of the cations is present in the form of one or more its oxides. For example, one may dissolve nickel oxide in nitric acid, thereby forming a nitrate. For example, one may dissolve zinc oxide in sulfuric acid, thereby forming a sulfate. One may dissolve nickel oxide in hydrochloric acid, thereby forming a chloride. Other means of providing the desired cation(s) will be readily apparent to those skilled in the art.

In general, as long as the desired cation(s) are present in the solution, it does not matter that much how it was obtained.

In general, one may use commercially available reagent grade materials. Thus, by way of illustration and not limitation, one may use the following reagents available in the 1988-1989 Aldrich catalog (Aldrich Chemical Company, Inc., Milwaukee, Wis.): nickel oxide (reagent number 20,388-2), nickel(II)perchlorate hexahydrate (reagent number 30,933-8), nickel peroxide (reagent number 22,721-8), nickel(II) sulfate heptahydrate (reagent number 20,389-0), nickel(II) sulfate hexahydrate (reagent number 22,767-6), nickel(II)nitrate hexahydrate (reagent number 24,407-4), nickel(II)hydroxide (reagent number 28,362-2), nickel(II) chloride hexahydrate (reagent number 20,386-6), strontium chloride hexhydrate (catalog number 20,466-3), strontium nitrate (catalog number 20,449-8), yttrium chloride (catalog number 29,826-3), yttrium nitrate tetrahydrate (catalog number 21,723-9), yttrium sulfate octahydrate (catalog number 20,493-5), zirconium nitrate (reagent number 25,734-6), zirconium sulfate hydrate (reagent number 20,500-1), zirconyl chloride hydrate (reagent number 20,502-8), zirconyl nitrate hydrate (reagent number 24,349-3), zinc sulfate heptahydrate (reagent number 22,137-6), zinc oxide (reagent number 20,553-2), zinc nitrate hydrate (reagent number 23,000-6), zinc chloride (reagent number 22,999-7). Thus, by way of further illustration, one may use one or more of the following reagents identified in the 1990/1991 Alfa Catalog (Johnson Matthey Alfa Products, Ward Hill, Mass.): sodium tungsten oxide (reagent number 12979), sodium silicate, tin oxide (reagent number 12283), tin sulfate (reagent number 11537), tin chloride (reagent number 10894), tin nitrate, and the like. This list is merely illustrative, and other compounds which can be used will be readily apparent to those skilled in the art. Thus, any of the desired reagents also may be obtained from the 1989-1990 AESAR catalog (Johnson Matthey/AESAR Group, Seabrook, N.H.), the Fisher 88 catalog (Fisher Scientific, Pittsburgh, Pa.), and the like.

As long as the metals present in the desired ferrite material are present in solution 10 in the desired stoichiometry, it does not matter whether they are present in the form of a salt, an oxide, or in another form. In one embodiment, however, it is preferred to have the solution contain either the salts of such metals, or their oxides.

The solution 10 of the compounds of such metals preferably will be at a concentration of from about 0.01 to about 1,000 grams of said reagent compounds per liter of the resultant solution. As used in this specification, the term liter refers to 1,000 cubic centimeters.

In one embodiment, it is preferred that solution 10 have a concentration of from about 1 to about 300 grams per liter and, preferably, from about 25 to about 170 grams per liter. It is even more preferred that the concentration of said solution 10 be from about 100 to about 160 grams per liter. In an even more preferred embodiment, the concentration of said solution 10 is from about 140 to about 160 grams per liter.

In one preferred embodiment, aqueous solutions of nickel nitrate, and zirconium nitrate with purities of at least 99.9 percent are mixed in the molar ratio of 2:1 and then dissolved in distilled water to form a solution with a concentration of 150 grams per liter.

In one preferred embodiment, aqueous solutions of yttrium nitrate, and zirconium nitrate with purities of at least 99.9 percent are mixed in the molar ratio of from about 0.08/1 to about 0.1/1 and then dissolved in distilled water to form a solution with a concentration of 150 grams per liter.

In one preferred embodiment, aqueous solutions of calcium nitrate, and zirconium nitrate with purities of at least 99.9 percent are mixed in the molar ratio of from about 0.08/t to about 0.1/1 and then dissolved in distilled water to form a solution with a concentration of 150 grams per liter.

In one preferred embodiment, aqueous solutions of strontium nitrate and lanthanum nitrate and manganese with purities of at least 99.9 percent are mixed in the molar ratio of 1-x/x/1 (wherein x is from about 0.1 to about 0.15) and then dissolved in distilled water to form a solution with a concentration of 150 grams per liter.

These examples will illustrate to those skilled in the art how to form solutions of the required cations in stoichiometric ratios so that the vapor produced from solution 10 will deposit a coating with the desired composition.

The following examples are presented to illustrate the claimed invention but are not to be deemed limitative thereof. Unless otherwise specified, all parts are by weight and all temperatures are in degrees centigrade.

Example 1

11.96 grams of yttrium nitrate hexahydrate and 38.232 grams of zirconyl nitrate hydrate were mixed with a sufficient amount of distilled water to make up a 200 gram/liter solution. The solution was then poured into a hemispherical plastic mist chamber with a capacity of 200 cubic centimeters which was equipped with a gas inlet and a mist outlet.

The mist chamber containing the solution was placed onto the aforementioned DeVilbiss ultrasonic nebulizer generator described in the specification; the ultrasonic generator was operated at a power of 70 watts and a frequency of 1.63 megahertz; the misting droplets formed were from about 0.5 to about 5.0 microns diameter in size. The gas inlet of the chamber was connected to a source of argon flowing at a rate of approximately 100 milliliters per minute.

The output from the misting chamber was connected to the TAFA plasma reactor equipped with the Lepel radio frequency generator, both of which are described in the specification. The Lepel radio frequency generator was operated at a power of 30 kilowatts and produced an alternating current of 4 megahertz. Argon gas was introduced into the bottom portion of the plasma reactor; the argon flow rate was 30 liters per minute.

The distance between the top of the plasma reactor and the substrate was 11 centimeters. In this example, the substrate used was a foil, which was approximately 1 millimeter in thickness, which had a substantially square shape, and which was about 2.0 centimeters by about 2.0 centimeters. The foil consisted of a nickel-chromium alloy which contained 80 weight percent of nickel and 20 weight percent of chromium.

The vapor from the plasma reactor deposited onto a foil substrate. A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

Example 2

The procedure of Example 1 was substantially repeated, with the exception that the substrate used was a disc with a diameter of about 2.54 centimeters and a thickness of about 2.0 millimeters. The substrate was a nickel zirconia cermet material obtained from the Argonne National Laboratory.

A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

Example 3

The procedure of Example 2 was substantially repeated, with the exception that, during the plasma deposition process, oxygen was flowed into the plasma reactor at a flow rate of 30 liters per minute.

A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

Example 4

The procedure of Example 1 was substantially repeated, with the exception that the solution was different. 11.31 grams of zirconyl nitrate hydrate were mixed with 0.602 grams of yttrium oxide powder, and a sufficient amount of distilled water together with ten drops of nitric acid were added to the mixture to make up a solution with a concentration of 20 grams per liter.

A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

Example 5

The procedure of Example 4 was substantially repeated, with the exception that the substrate used was a glass slide which was rectangular in shape and was 2.0 centimeters×10 centimeters by 2.0 millimeters. The slide consisted essentially of lime soda glass.

A coated object with a film thickness of approximately 1 microns was obtained. X-ray diffraction analysis indicated the presence of an yttria-stabilized zirconia phase. Energy Dispersive X-ray analysis indicated the presence of both yttrium and zirconium in the composition.

Example 6

The procedure of Example 1 was substantially repeated, with the exception that a different solution was used. The solution contained $Na_2OWO_4 \cdot 2H_2O$ in sufficient water to make up an aqueous solution with a concentration of 300 grams per liter. Furthermore, the substrate used in this experiment was the glass slide described in Example 5.

A coated object with a film thickness of approximately 1 microns was obtained. Energy Dispersive X-ray analysis indicated the presence of both sodium and tungsten in the composition.

Example 7

The procedure of Example 6 was substantially followed, with the exception that a 60 gram per liter solution of $SnCl_4 \cdot 5H_2O$ was used.

A coated object with a film thickness of approximately 1 microns was obtained. X-ray diffraction analysis indicated the presence of a tin oxide phase. Energy Dispersive X-ray analysis indicated the presence of tin in the composition.

Example 8

The procedure of Example 7 was substantially repeated, with the exception that the solution used was a 100 gram per liter solution of $Zn(NO3)_2 \cdot 6H_2O$.

A coated object with a film thickness of approximately 1 microns was obtained. Energy Dispersive X-ray analysis indicated the presence of zinc in the composition.

Example 9

The procedure of Example 8 was substantially repeated, with the exception that the substrate used was a niobium foil which was substantially square in shape and was about 2.0 centimeters by about 2.0 centimeters by about 1.0 millimeter thick.

A coated object with a film thickness of approximately 1 microns was obtained. Energy Dispersive X-ray analysis indicated the presence of zinc in the composition.

Example 10

The procedure of Example 5 was substantially repeated, with the exception that the solution used was a 50 gram per liter solution of $Na_2SiO_3 \cdot 5H_2O$.

A coated object with a film thickness of approximately 1 microns was obtained. X-ray diffraction analysis indicated the presence of a sodium silicate phase. Energy Dispersive X-ray analysis indicated the presence of silicon in the composition.

Example 11

The procedure of Example 10 was substantially followed, with the exception that the substrate used was identical to the substrate used in Example 9.

A coated object with a film thickness of approximately 1 microns was obtained. X-ray diffraction analysis indicated the presence of a sodium silicate phase. Energy Dispersive X-ray analysis indicated the presence of silicon in the composition.

It is to be understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

In one embodiment of applicant's invention, the process of the invention may be used to coated alumina or zirconia onto one or more of the surfaces of a concrete substrate in order to improve the mechanical and thermal properties of such substrate.

Thus, by way of illustration, in one embodiment the relative position of the substrate and the plasma reactor may be reversed. In the preferred embodiment illustrated in FIG. 1, the substrate is disposed above the plasma reactor. In another embodiment, not shown, the substrate may be diposed below the plasma reactor and the coating material may flow downwardly.

Thus, by way further illustration, and referring to FIG. 1, plasma reactor 24 may be tilted, reversed, or otherwise differently disposed than shown in such Figure without adversely affecting applicant's process.

I claim:

1. A process for coating a layer of material with a thickness of from about 1 to about 100 microns onto a substrate at a deposition rate of from about 0.01 to about 10 microns per minute per 35 square centimeters of substrate surface, comprising the steps of:
   (a) providing a solution comprised of a first yttrium compound and a second zirconium compound, wherein said yttrium compound and said zirconium compound are present in said solution at a concentration of from about 0.01 to about 1,000 grams per liter and at a molar ratio of from about 0.08/1 to about 0.01/1;
   (b) subjecting said solution to ultrasonic sound waves at a frequency in excess of 20,000 hertz, and to a substantially atmospheric pressure of at least 600 millimeters of mercury, thereby causing said solution to form into an aerosol;
   (c) providing a radio frequency plasma reactor;
   (d) generating a plasma within said radio frequency reactor;
   (e) contacting said aerosol with said plasma within said plasma reactor while subjecting said aerosol to a substantially atmospheric pressure of at least 600 millimeters of mercury and to a radio frequency alternating current at a frequency of from about 100 kilohertz to about 30 megahertz, thereby forming a vapor;
   (f) providing said substrate disposed outside of said plasma reactor; and
   (g) contacting said vapor with said substrate, thereby forming said layer of material.

2. The process as recited in claim 1, wherein said substrate consists essentially of a nickel-zirconia composition.

3. The process as recited in claim 1, wherein said substrate consists essentially of strontium-doped lanthanum manganite.

4. A process for coating a layer of material with a thickness of from about 1 to about 100 microns onto a substrate at a deposition rate of from about 0.01 to about 10 microns per minute per 35 square centimeters of substrate surface, comprising the steps of:
   (a) providing a solution comprised of a first nickel compound and a second zirconium compound, wherein said nickel compound and said zirconium compound are present in said solution at a concentration of from about 0.01 to about 1,000 grams per liter and at a molar ratio of about 2/1;
   (b) subjecting said solution to ultrasonic sound waves at a frequency in excess of 20,000 hertz, and to a substantially atmospheric pressure of at least 600 millimeters of mercury, thereby causing said solution to form into an aerosol;
   (c) providing a radio frequency plasma reactor;
   (d) generating a plasma within said radio frequency reactor;
   (e) contacting said aerosol with said plasma within said plasma reactor while subjecting said aerosol to a substantially atmospheric pressure of at least 600 millimeters of mercury and to a radio frequency alternating current at a frequency of from about 100 kilohertz to about 30 megahertz, thereby forming a vapor;
   (f) providing said substrate disposed outside of said plasma reactor; and
   (g) contacting said vapor with said substrate, thereby forming said layer of material.

5. The process as recited in claim 4, wherein said substrate consists essentially of yttria-stabilized zirconia.

6. The process as recited in claim 4, wherein said substrate consists essentially of calcia-stabilized zirconia.

7. The process as recited in claim 4, wherein said substrate consists essentially of platinum.

8. The process as recited in claim 4, wherein said substrate consists essentially of magnesium doped lanthanum chromite.

9. The process as recited in claim 4, wherein said substrate consists essentially of manganese doped cobalt chromite.

10. A process for coating a layer of material with a thickness of from about 1 to about 100 microns onto a substrate at a deposition rate of from about 0.01 to about 10 microns per minute per 35 square centimeters of substrate surface, comprising the steps of:
    (a) providing a solution comprised of a first strontium compound, a second lanthanum compound, and a third manganese compound, wherein said strontium compound, said lanthanum compound, and said manganese compound are present in said solution at a concentration of from about 0.01 to about 1,000 grams per liter and at a molar ratio of 1-x/x/1, wherein x is from about 0.1 to about 0.15;
    (b) subjecting said solution to ultrasonic sound waves at a frequency in excess of 20,000 hertz, and to a substantially atmospheric pressure of at least 600 millimeters of mercury, thereby causing said solution to form into an aerosol;
    (c) providing a radio frequency plasma reactor;
    (d) generating a plasma within said radio frequency reactor;
    (e) contacting said aerosol with said plasma within said plasma reactor while subjecting said aerosol to a substantially atmospheric pressure of at least 600 millimeters of mercury and to a radio frequency alternating current at a frequency of from about 100 kilohertz to about 30 megahertz, thereby forming a vapor;
    (f) providing said substrate disposed outside of said plasma reactor; and
    (g) contacting said vapor with said substrate, thereby forming said layer of material.

11. The process as recited in claim 10, wherein said substrate consists essentially of yttria-stabilized zirconia.

12. The process as recited in claim 10, wherein said substrate consists essentially of platinum.

13. The process as recited in claim 10, wherein said substrate consists essentially of manganese-doped cobalt chromite.

14. The process as recited in claim 10, wherein said substrate consists essentially of magnesium doped lanthanum chromite.

* * * * *